United States Patent [19]
Akar et al.

[11] Patent Number: 5,216,361
[45] Date of Patent: Jun. 1, 1993

[54] MODULAR BOARD TEST SYSTEM HAVING WIRELESS RECEIVER

[75] Inventors: Armagan A. Akar, San Jose; Scott N. Grimes, Granada Hills; Stephen E. DeSimone, Morgan Hill, all of Calif.

[73] Assignee: Schlumberger Technologies, Inc., San Jose, Calif.

[21] Appl. No.: 727,278

[22] Filed: Jul. 10, 1991

[51] Int. Cl.⁵ .......................... G01R 1/00; G01R 1/02
[52] U.S. Cl. .............................. 324/158 F; 324/72.5; 324/158 P; 361/384
[58] Field of Search ............ 324/158 P, 158 F, 72-73, 324/73.1; 361/384, 414; 439/83; 174/255

[56] References Cited

U.S. PATENT DOCUMENTS

| | | | |
|---|---|---|---|
| 3,963,985 | 6/1976 | Geldermans | 324/158 F |
| 4,230,985 | 10/1980 | Matrone et al. | |
| 4,517,512 | 5/1985 | Petrich et al. | 324/158 F |
| 4,574,235 | 3/1986 | Kelly et al. | 324/158 F |
| 4,614,386 | 9/1986 | Driller et al. | 324/158 F |
| 4,724,377 | 2/1988 | Maelzer et al. | 324/158 F |
| 4,736,374 | 4/1988 | Kump et al. | 371/73.1 |
| 4,758,780 | 7/1988 | Coon et al. | 324/158 F |
| 4,771,236 | 9/1988 | Banks | 324/158 F |
| 4,794,509 | 12/1988 | Nussbaumer | 361/384 |
| 4,797,783 | 1/1989 | Kohmoto et al. | 361/384 |
| 4,868,493 | 9/1989 | Becker | 324/158 F |
| 4,922,381 | 5/1990 | Longerich et al. | 361/414 |
| 4,928,061 | 5/1990 | Dampier et al. | 361/414 |
| 4,952,872 | 8/1990 | Driller et al. | 324/158 F |
| 5,032,789 | 7/1991 | Firooz et al. | 324/73.1 |

FOREIGN PATENT DOCUMENTS

0047572  2/1990  Japan .............................. 324/158 F

*Primary Examiner*—Ernest F. Karlsen
*Assistant Examiner*—William J. Burns
*Attorney, Agent, or Firm*—Steven P. Koda

[57] ABSTRACT

A modular ATE system includes a plurality of test modules and a receiver for use with a variety of fixtures to which printed circuit boards are to be coupled. Each test module includes a plurality of pin cards controlled by a single module controller. Multiple test module are included for testing a variety of functions. Test signals are generated by discrete sets of pin cards and controllers, then output to the receiver for interconnection to a fixture and printed circuit board(s) under test. A substantially wireless receiver is provided, including a translation board for electrically coupling test module pin cards to the fixture. By eliminating wiring and cabling by using a prefabricated translation board, noise is substantially reduced and test signal quality improved. The translation board defines prescribed signal mapping for interconnecting the I/O pins of ATE pin cards to the underside of the fixture. Different translation boards may have different mappings. The ATE can be adapted for use with fixtures having different underside layouts by changing the test modules and/or the receiver. As a result, the ATE can be adapted to emulate many conventional ATE's which are limited to a fixed fixture underside layout.

14 Claims, 9 Drawing Sheets

MODULAR BOARD TEST SYSTEM HAVING WIRELESS RECEIVER

CROSS REFERENCE TO RELATED APPLICATION

This invention is related to U.S. Patent application Ser. No. 07/649,081 filed Feb. 1, 1991, issued Sept. 8, 1992 as U.S. Pat. No. 5,146,159 for PIN DRIVER FOR IN-CIRCUIT TEST APPARATUS. The content of that application is incorporated herein by reference and made a part hereof.

BACKGROUND OF THE INVENTION

This invention relates to automatic testing equipment (ATE) for electronic circuits and, more particularly, to an improved architecture and receiver for interfacing the ATE to a device under test.

Electronic circuit boards are often tested to find and remove defects before the boards are sold to end users. The tests often consist of simulating the intended operating environment of the circuit board and comparing the output from the circuit board to the output expected from a defect-free board. The test input may be a sine wave, a ramped voltage input or a current pulse applied to the board inputs. The test inputs also may be similar voltages or currents applied to specific nodes within the circuit.

To accomplish the foregoing, the typical ATE must include (1) a mechanism for transmitting the input to the circuit board being tested; and (2) a mechanism for receiving the test results from the circuit board. The ATE element that performs these functions is called the receiver. The receiver is ordinarily coupled to a driver/sensor board which functions as a voltage and current source capable of generating a variety of analog and digital input signals, such as sine waves, square waves and the like. The driver/sensor board generates test signals, then relays test signal responses to a central processing unit. Multiple driver/sensor boards are mounted to a common backplane allowing communication among the driver/sensor boards and to and from a central processing unit or control workstation.

To test a circuit board on known ATE's, the circuit board is mounted on a fixture which has I/O pins that make electrical contact with either the regular circuit board input pins or with specific nodes within the circuit. Vacuum is typically used to secure the circuit board to the fixture. The fixture has other I/O pins that mate with corresponding I/O pins on the receiver. The correspondence between the input and output pins of the fixture is governed by the fixture's internal wiring.

Known ATE's include a fixed I/O pin mapping to the underside of the fixture using cables. Thus, although different fixtures can be substituted for testing different circuit board layouts, the underside of any fixture to be connected to a given ATE has the same layout. Accordingly, known ATE's are not adaptable for use with different fixture undersides.

Further, known ATE's have many problems associated with them. For example, the use of a common backplane for all pin cards limit the variety of tests that can be executed by a single ATE. Furthermore, extensive wire cabling often is used to connect the driver/sensor board with the receiver I/O pins and to connect the fixture I/O pins with the receiver. This can create undesirable noise interference as the current variations in each wire induce voltages in adjacent wires. As a result, the quality of the generated test signals and the resulting output signals may deteriorate significantly before reaching their respective destinations. The effect of the noise is particularly severe at high frequencies.

In addition, lengthy ground wires often are used for grounding conventional ATE system elements. The effectiveness of the grounding of each ATE element diminishes as the length of the ground wire increases. For example, each receiver pin card, as well as a circuit board under test, is grounded by connection to a ground source at a driver/sensor board base. Such a lengthy ground wire connection contributes to variations in the signals generated by the individual pin cards and hence affects the accuracy of the test results.

SUMMARY OF THE INVENTION

According to the invention a substantially wireless receiver is provided enabling a versatile ATE configuration and improved test signal quality. The receiver includes a translation board for electrically coupling pin cards to a fixture so as to avoid lengthy wires and cables. By eliminating the wiring and cabling from the connections between the pin cards and the fixture, noise is substantially reduced and test signal quality improved.

According to one aspect of the invention, the translation board defines the signal mapping for interconnecting the I/O pins of ATE pin cards to the underside of a fixture. Different translation boards may have different mappings.

According to another aspect of the invention, a modular versatile ATE configuration is achieved which can be adapted for use with fixtures having different underside layouts (e.g., side toward receiver, opposite side engaging circuit panels under test). As a result, the ATE can be adapted to emulate many conventional ATE's which are limited to a fixed fixture underside layout. Such versatility is achieved by the modular configuration of the ATE and the replaceable receiver of this invention. Rather than re-wire an existing ATE, which is economically unfeasible, a second receiver is substituted which has a translation board with different mapping than the translation board of the receiver being replaced.

The modular ATE configuration includes a plurality of module pin cards and a plurality of module controllers, along with the receiver and a fixture. A plurality of pin cards (e.g., 6) are controlled by a single module controller. Multiple module controllers are included for testing a variety of functions. Test signals are generated by discrete sets of pin cards and controllers within the receiver. The pin cards and controller in each module are self-supporting units, thereby minimizing the function of the communications backplane.

The invention will be better understood by reference to the following detailed description taken in conjunction with the accompanying drawings.

BRIEF DESCRIPTION OF THE DRAWINGS

FIG. 13 is a fragmentary vertical section of a conventional fixture.

DETAILED DESCRIPTION OF THE PREFERRED EMBODIMENT

ATE Overview

Figure 1:
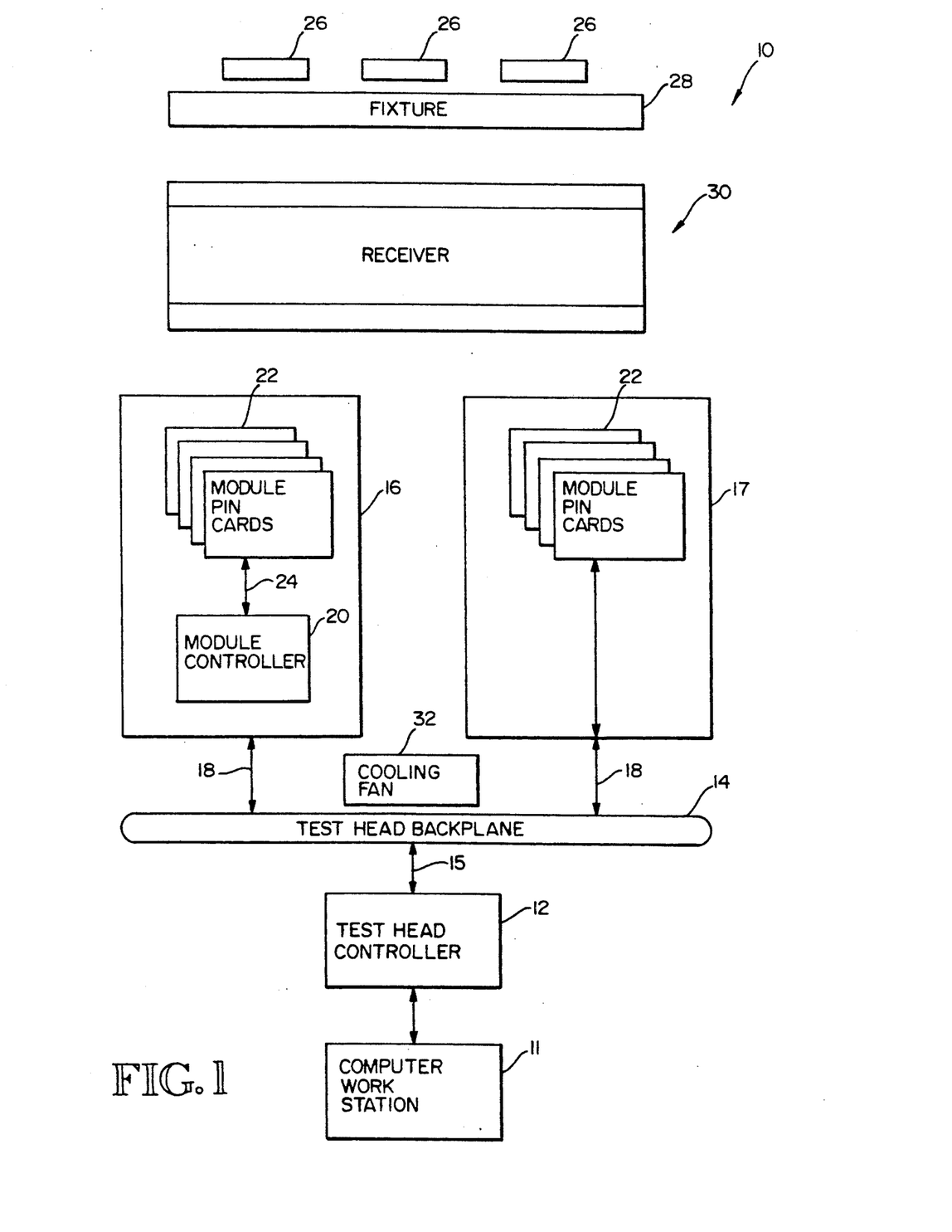
FIG. 1 is a block diagram of a specific embodiment of a modular ATE according to an embodiment of the present invention.

FIG. 1 is a block diagram of a modular ATE system 10 according to an embodiment of the present invention. A conventional work station 11, such as a SPARC station built by Sun Microsystems, communicates with a modular test head controller 12 which supervises the execution of test programs and analyzes test results. Test head controller 12 communicates with a test head backplane 14 through a controller-backplane bus 15.

A plurality of replaceable test modules 16 are coupled to test head backplane 14 through a module-backplane bus 18. Backplane 14 allows test modules 16 to communicate with one another and with the test head controller 12.

In this embodiment, each test module 16 includes a module controller 20 and a plurality of pin cards 22. Pin cards 22 communicate with their associated module controller 20 and with each other through module bus 24. A pin card 22 includes pin drivers for driving a test signal or sensing a signal response. One embodiment of a pin driver for pin cards 22 is described in U.S. Patent application Ser. No. 07/649,081 filed Feb. 1, 1991 for PIN DRIVER FOR IN-CIRCUIT TEST APPARATUS. The content of that application is incorporated herein by reference and made a part hereof.

Each controller 20 defines the drive/sense operation and timing of the pin drivers. Controller 20, in addition, receives the resulting output from one or more circuit boards 26 under test. Each module 16 provides power to its controller 20 and pin cards 22 independently of the other modules.

In some embodiments, one or more modules 17 including pin cards only may be provided. Such a module serves as a "slave" under the control of a controller 20 of another module 16. Such module 17 duplicates the functions of another module 16. Thus, a circuit board 26 having, for example, duplicate circuits to be tested can have the circuits tested in parallel in response to commands from a single "master" module 16.

Modules 16, 17 communicate with a circuit board under test 26 through a fixture 28 and a receiver 30. The fixture 28 is positioned adjacent to the receiver 30 with electrical coupling maintained with the receiver 30 by contacts on the fixture 28 and receiver 30. The circuit boards 26 are secured to fixture 28 by vacuum or any other suitable means. Fixture I/O pins provide electrical coupling with terminals and circuit nodes of each circuit board 26. A suitable fixture is described in U.S. Pat. No. 4,344,033, issued Aug. 10, 1982 for VACUUM-ACTUATED TEST FIXTURE FOR PRINTED CIRCUIT BOARDS (Stower et. al.), the disclosure of which is incorporated herein by reference.

FIG. 13 shows a partial cross-section of a fixture described in such patent. (The following supporting text is taken from the patent at col. 4, lines 24-65). A printed circuit board ("PCB") 329 coupled to the fixture may be loaded with any number of components included in circuits. The fixture includes a base pate 330 carrying multiple readily replaceable spring probes or contacts 366 having mounting sleeves 367. Upwardly spring-biased contact heads 368 contained within the sleeves 367 are adapted for electrical contact under spring pressure with terminals 369 of components 370 on the PCB 329.

It should be understood that the replaceable spring probes or contacts 366 on the base plate 330 can be arrayed thereon in many ways to correspond with the arrangement of components an circuitry elements on the PCB 329 which may be varied. The particular arrangement of spring probes 366 can be customized by the user of the test fixture or by its manufacture. A large supply of the probes 366 can be provided and held within extra openings in the base plate 330 near one edge thereof outside of the area encompassed by the PCB 329. Depending upon the character of the PCB circuitry, the spring probes 366 may be arrayed in continuous straight rows or interrupted rows or they may be randomly arrayed to satisfy the circuitry test requirements.

Lead wires 371 trailing from the test probes 366 are contained within a space between the base plate 330 and the patchboard 351. They are attached to all detent terminal elements 72 releasably held within openings 373 of the patchboard 351. The arrangement holds the terminals 372 firmly in place, promotes ease of wiring the test fixture, and prevents the terminals from being pushed out of place when electrical contact is made with coacting test apparatus through the receiver.

Figure 2:
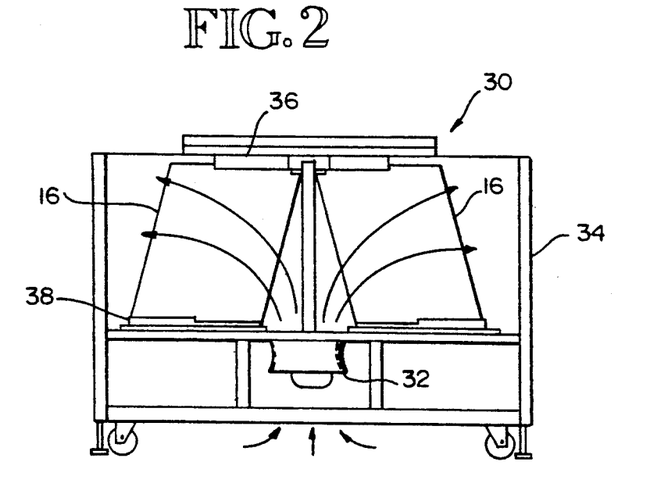
FIG. 2 is a cut-away view of a chassis housing ATE modules and the receiver according to an embodiment of the present invention.

Referring to FIGS. 1 and 2, a cooling fan 32 is centrally positioned for blowing air through a central channel between rows of modules 16. Arrows are shown for depicting the air flow in FIG. 2. By originating cool air at a central channel both rows receive cool air. Compared to a cooling approach in which air is forced from one side or the other resulting in one row getting air previously exposed to and warmed by the other row, the cooling efficiency is greater for the FIG. 2 embodiment.

FIG. 2 shows a chassis 34 for housing the backplane 14, modules 16, receiver 30 and fan 32. According to such an embodiment, the chassis 34 receives two parallel rows of three modules 16 (17) per row. The modules 16 (17) are held in place by upper ZIF connectors 36 and lower ZIF connectors 38. Each module 16 includes eight pin cards 22 and two controllers 20. The pin cards and controllers may be selected and grouped in various configurations. For example, one or more of the modules 16 may be a functional test module, an in-circuit test module, a bus cycle emulation module, etc. When increased throughput is desired, two or more modules 16 can perform parallel tests upon one or more circuit boards 26. For example, when a circuit board 26 has more pins than a single module 16 can provide, several modules 16 may be used to provide test signals for the necessary number of pins.

Receiver

The receiver of this invention minimizes the length of the electrical path between the test signal source (e.g., pin drivers) and the circuit board 26 being tested. To do so, cable interconnections for connecting the receiver 30 to the pin cards 22 and fixture 28 are eliminated. The short, cableless signal path minimizes noise in the voltage or current signals, especially at high signal frequencies. The cableless signal path also results in a more reliable test signal environment.

Figure 3:
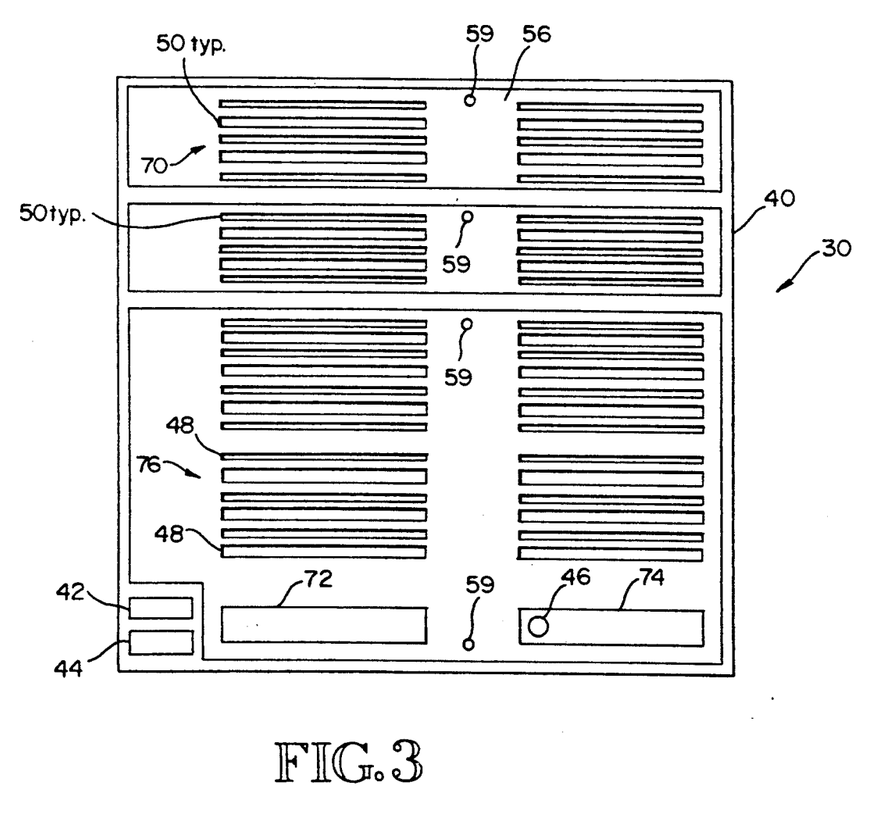
FIG. 3 is a top plane view of the receiver of FIGS. 1 and 2.
Figure 4:
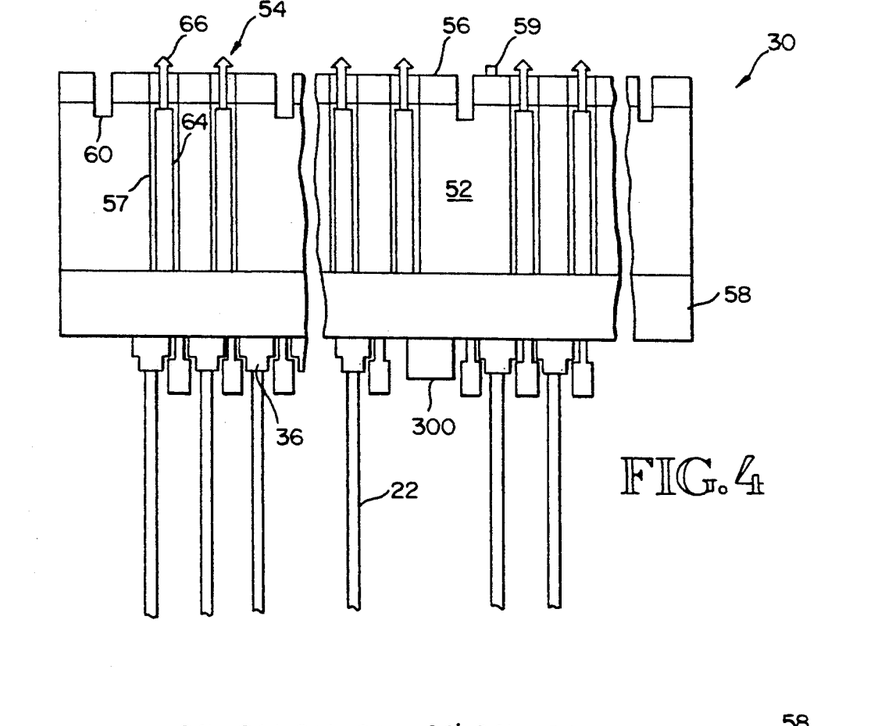
FIG. 4 is a cut-away view of the receiver according to an embodiment of this invention.

FIGS. 3-4 illustrate an embodiment of the receiver 30 according to the present invention. This embodiment is particularly useful when many boards 26 having different pin patterns are to be tested. FIG. 3 is a top view of the receiver showing the face which receives the fixture 28 (of FIG. 1). The receiver 30 protrudes through the chassis 34. The receiver 30 is connected to the chassis 34 (FIG. 2) and held in place through gasketing (not shown). Two vacuum ports 42, 44 are included which serve as a channel through which suction is exerted to hold the circuit panels under test 26 to the fixture 28 (see FIGS. 1 and 3). In addition, another vacuum port 46 is included for holding the receiver 30 to the fixture 28. Gasketing seals the inner area of the receiver 30 allowing the suction forces to secure the circuit boards 26 to the fixture 28 and the fixture 28 to the receiver 30.

The receiver 30 as shown in FIG. 3 includes slots 50. The slots 50 are configured in groups as shown. As shown, groups for up to 8 modules 16 (17) may be configured into the ATE 10 embodiment. The number of slots in each group may vary. Each slot may receive up to 192 connections in one embodiment for coupling to the underside of a fixture 28. For different fixture underside patterns, different connection layouts may be implemented within the respective slots depending on the receiver 30 embodiment.

In a preferred embodiment, the slots 50 are used for four types of connector fields. Universal pin fields 70 are used for connecting to modules 16. A UUT power supply field 72 is used for providing power supply interconnections to the fixture 28 circuit panel 26 under test. Instrumentation field 74 is used for providing voltmeter, timer, function generator and other instrumentation interconnections to the fixture 28 and circuit panel 26 under test. In addition, special facility connections 76 provide connections for a high frequency clock, trigger, lock, digital highways and special functions.

As shown in FIG. 4, receiver 30 includes a support block 52, a plurality of pogo pin assemblies 54, a retainer plate 56, and a translation board 58. Each of the support block, retainer plate and translation board are formed from an insulating material such as GIO (an industrial name for an epoxy-coated fiberglass material). A cradle (not shown) accepts and aligns the fixture 28 for contact with the receiver 30. The receiver 30 includes alignment pins 59 (FIG. 3) at retainer plate 56 for establishing fine alignment between the receiver 30 and fixture 28. The support block 52 according to the preferred embodiment is made of an epoxy material GIO and has a thickness of approximately seven-eighths inches. Note that the thickness is exaggerated relative to the support block length in FIG. 4 for purposes of illustration. The support block 52 includes a plurality of cylindrical channels 57. Each channel 57 may receive a pogo pin assembly 54. The channels 57 align the respective pogo pin assemblies 54 so as to pass through the retainer plate 56 and into slots 50. The pin assembly 54 contacts the underside of fixture 28 when the fixture 28 is held to the receiver 30.

According to one embodiment, up to 192 pogo pin assemblies 54 may protrude into a single universal connector-type slot 50. Pogo pin assemblies 54 provide the electrical connection between the fixture 28 and the translation board 58. A receptacle 64 for each pin 66 is free to move (e.g., "floats") within the respective channel 57 in the support block 52. The pin 66 is spring-biased within the receptacle 64 to protrude outward toward the fixture 28. When a suction force is provided, the fixture 28 is pulled to the receiver 30 bringing each pin 66 in electrical contact with the fixture 28 underside. The connection between the spring loaded pogo pins 54 and the fixture 28 presses the pogo pin receptacle 64 against the translation board 58 at a translation board contact pad (not shown).

The retainer plate 56 exposes the pin 66 of the pogo pin assembly 54, but prevents the pin receptacle 64 from exiting the support block channel 57. The retainer plate 56 preferably is covered with gasketing (not shown) along the surface adjacent to the fixture 28, while leaving the slots 50 uncovered.

Translation Board

Referring to FIG. 4, translation board 58 is electrically coupled to a plurality of upper ZIF connectors 36, which, in turn, are coupled to pin cards 22 of modules 16 (17). The pogo pin assemblies 54 are placed within the support block 52 in a format compatible with the input pins or circuit nodes of the fixture 28 to be coupled to the receiver 30. The translation board 58 converts the pin pattern defined by the ZIF connectors 36 to the pattern of pogo pin assemblies 54 based upon a prescribed mapping pattern. For different translation board embodiments, different mapping relations may be prescribed.

Figure 5:
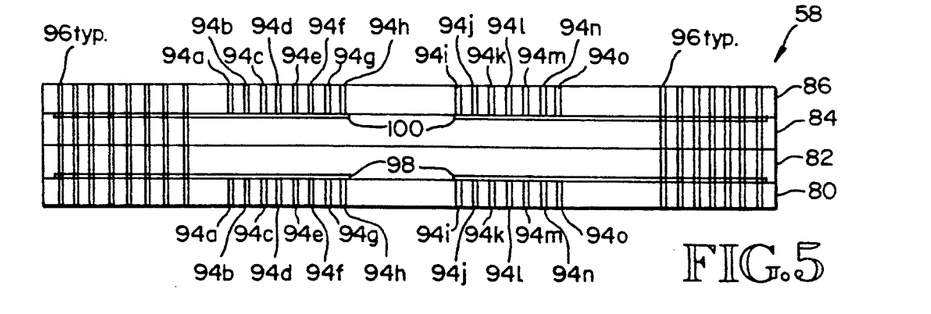
FIG. 5 is a cross-sectional view of the translation board of the receiver in FIG. 4.

FIG. 5 shows a cross-sectional view of a translation board 58 embodiment formed with four layers 80, 82, 84, 86. Such embodiment also may include an insulating mask layer (not shown) on the bottom side adjacent to the modules 16.

Figure 6:
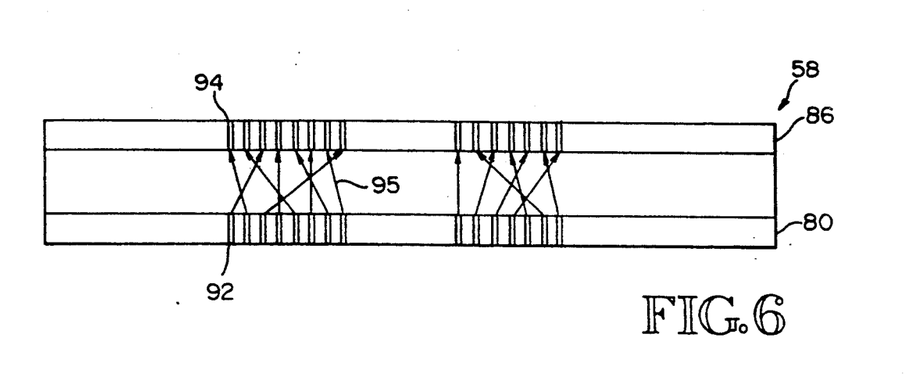
FIG. 6 is a logical diagram of the mapping performed by the translation board of FIG. 5 for the illustrated row of contacts.

FIG. 5 shows mapping of pin card contacts 92 to pogo pin assembly contacts 94 for a given row of pin card contacts 92a–o. Such contacts 92, 94 are located on the translation board 58. FIG. 6 shows a logical representation of a sample mapping between contacts 92a–o and contacts 94a–o. Arrows 95 are used to show the mapping of a contact 92 to a contact 94. Note that although the example shows that all contacts 92a–o map to the contacts in row 94, in an alternate embodiment one or more of the contacts 92a–o instead may map to contacts in other rows.

Referring again to FIG. 5, mapping is achieved by conductive strips 98 which couple a contact 92 to the outer area of the board 58 at a post 96 at layer 82. Conductive strips 100 then couple the outer area posts 96 to the appropriate contacts 94 at layer 84. More specifically, the pin contacts 92 protrude to the second layer 82, then are coupled to the outer area of the board through electrical conductor strips 98. A separate conductive path is provided for each pin contact 92a–o. Conductor posts 96 provide electrical coupling between layers. As shown posts 96 protrude all the way through from the bottom layer 80 to the top layer 86 enabling economic production of the post holes. At layer 84 conductive strips 100 are provided for mapping from the outer posts 96 to the pogo pin contacts 94a–o.

Figure 7:
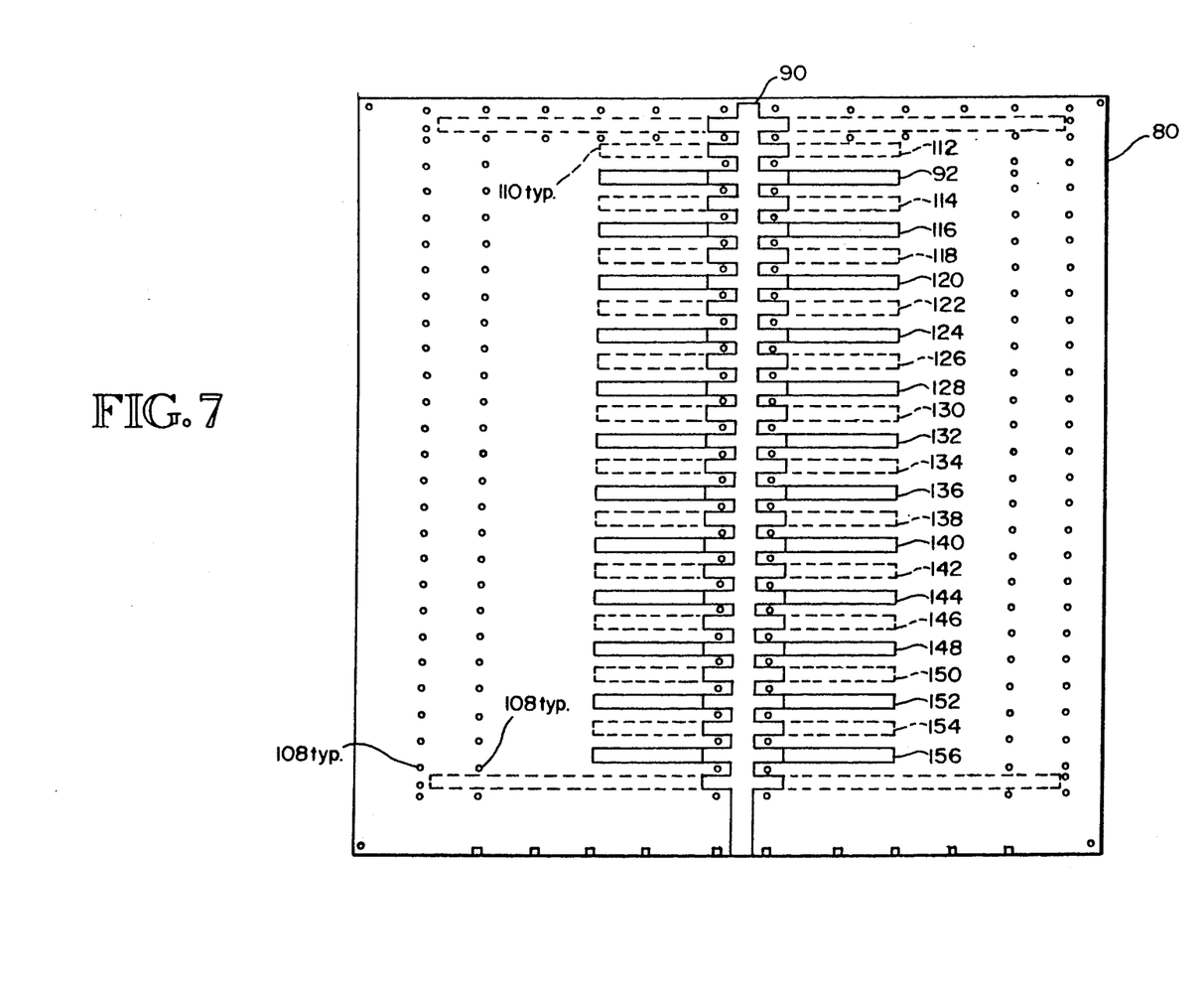
FIG. 7 is a plane view of the underside layer of the translation board of FIG. 5.

FIG. 7 shows a phantom plan view of layer 80. Layer 80 is the underside layer of translation board 58 adjacent to the pin card connectors in the FIG. 4 view. Layer 80 includes contact regions 110 for providing electrical coupling to the pin cards 22. Layer 80 also includes a central ground line 90 and screw holes 108 for receiving the ZIF connectors 36. The contact regions 110 are formed in rows 92 and 112-156. Each row includes two contact regions having up to 60 contacts per region. The number of contacts and maximum number of contacts per region, however, may vary for different embodiments.

Figure 8:
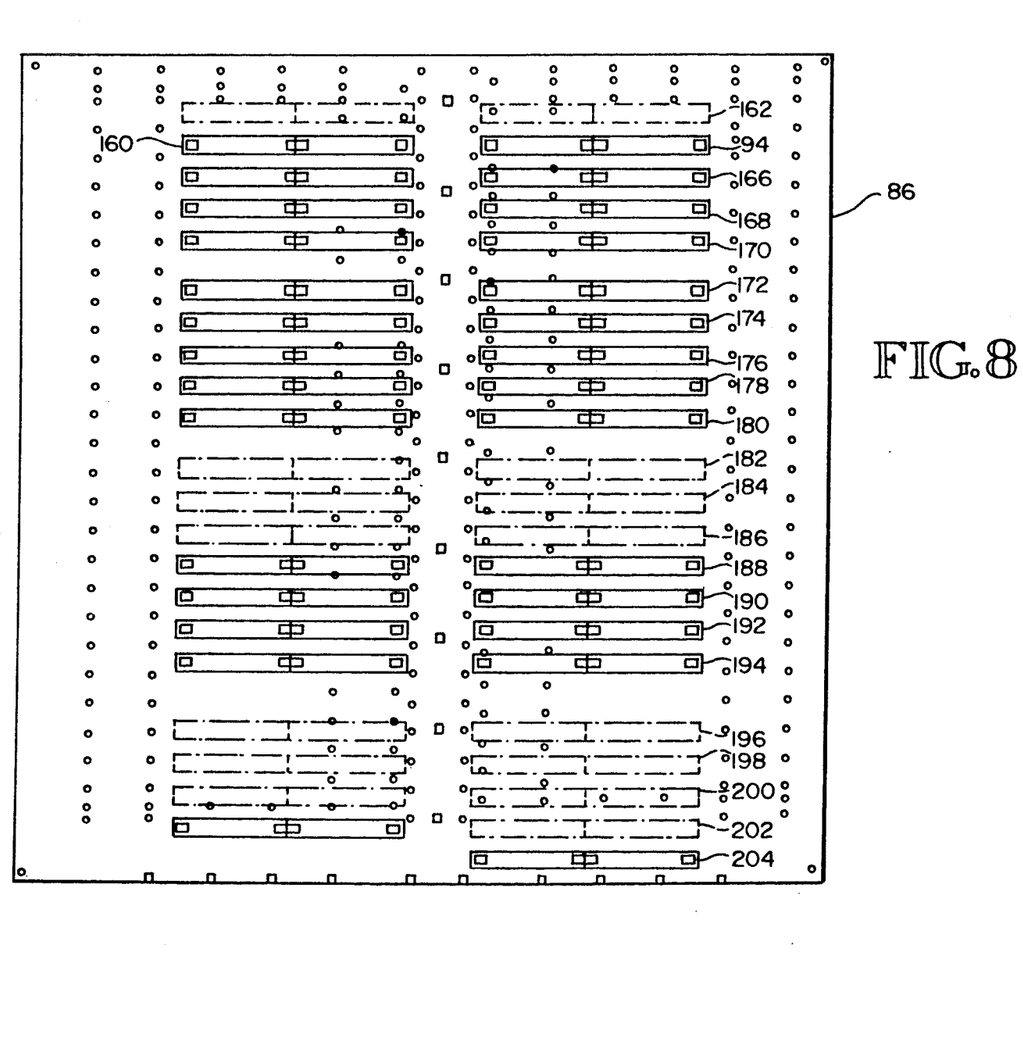
FIG. 8 is a plane view of the upperside layer of the translation board of FIG. 5.

FIG. 8 shows a plan view of the layer 86. Layer 86 is the upperside layer of translation board 58 adjacent to the support block 52 in the FIG. 4 view. Layer 86 includes contact regions 160 for providing electrical coupling to the pogo pin assemblies 54. The contact regions 160 are formed in rows 94 and 164-204. Each row may contain two contact regions 160 having up to 192 contacts per region. The number of contacts per region and the maximum number of contacts per region may vary for different embodiments. In the embodiment shown in FIG. 8 phantom lines are shown for rows 162, 182, 184, 186, 196, 198, 200 and 202 to indicate that the contact regions for such rows are empty. Thus, no electrical contact to fixture 28 is provided in such areas for the illustrated embodiment.

Figure 9:
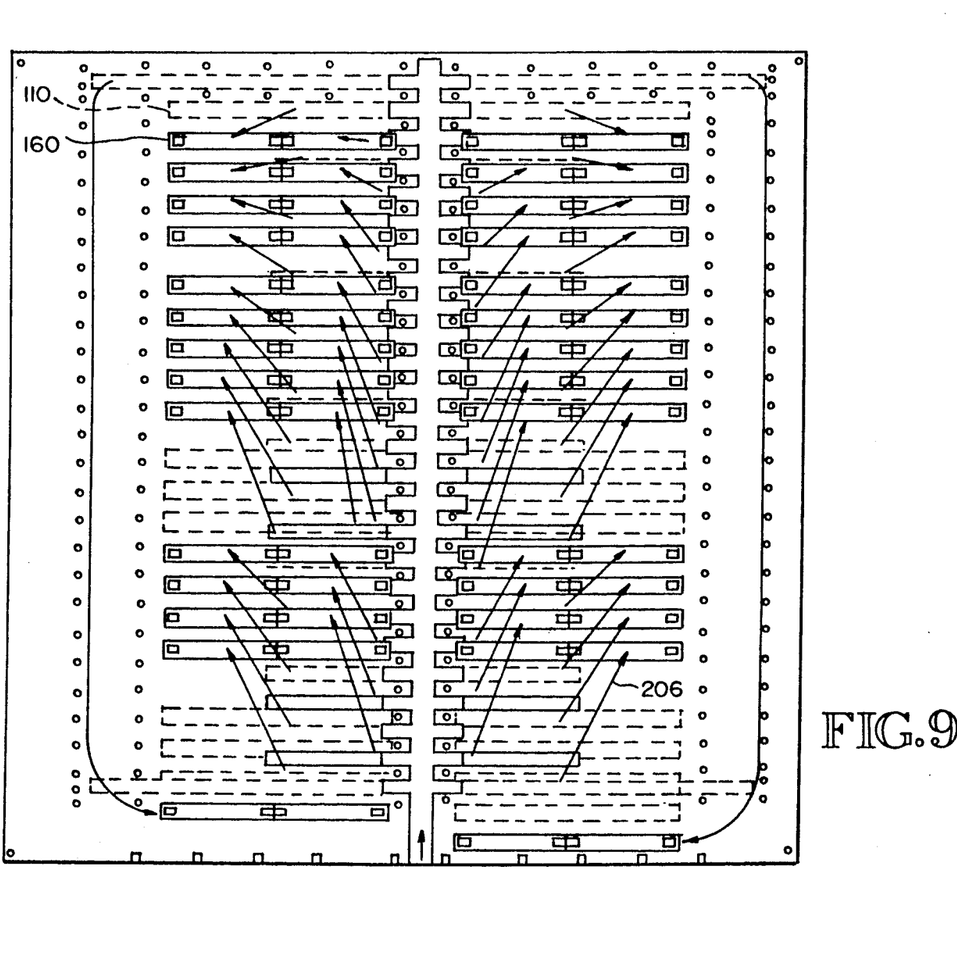
FIG. 9 is a diagram of an overlay of the underside and upperside layers of the translation board of FIG. 5, including arrows showing the mapping from the underside contacts to the upperside contacts.
Figure 10:
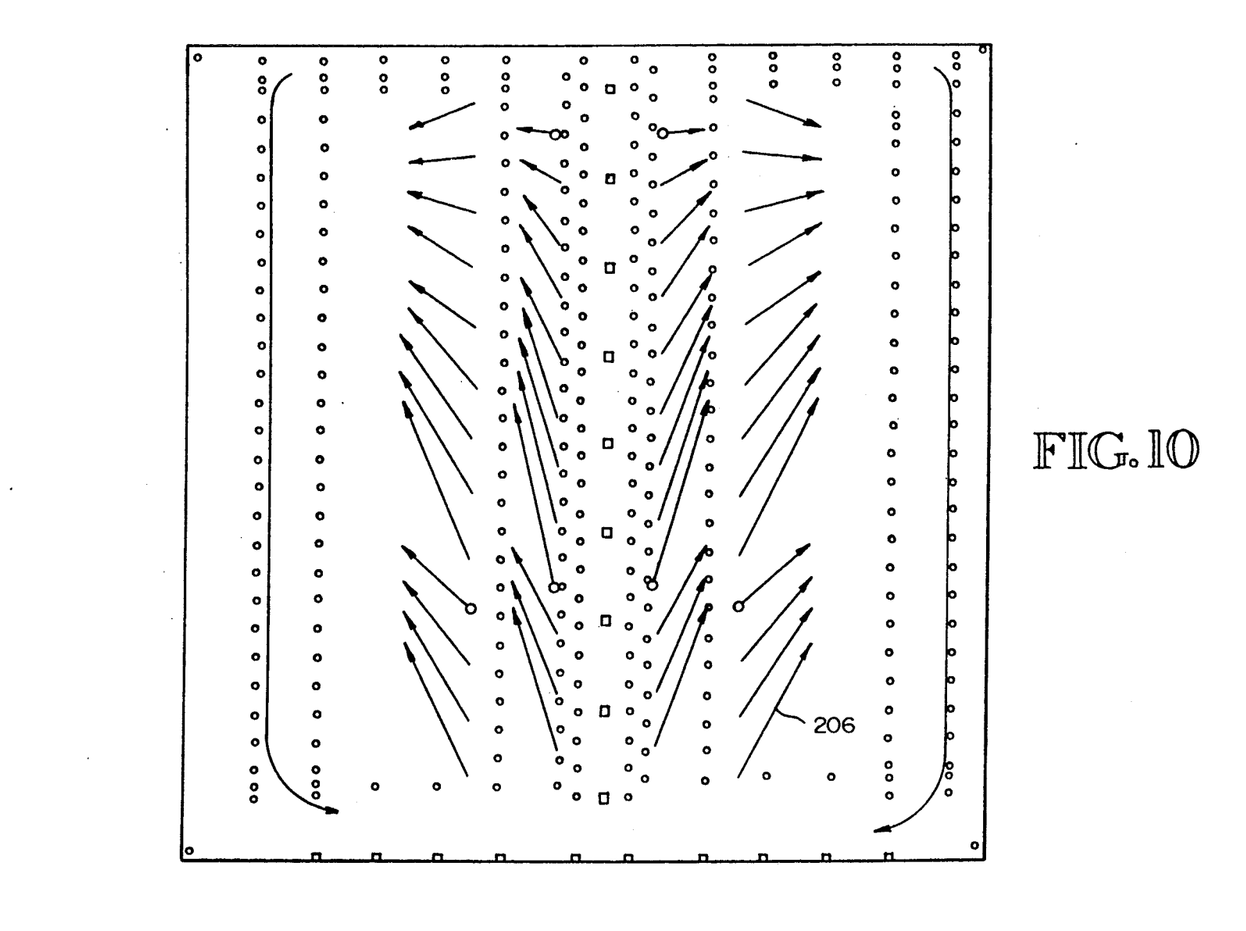
FIG. 10 is a logic diagram representing the mapping performed by the two middle layers of the translation board of FIG. 5 for an embodiments in which the mapping is performed region by region.

FIG. 9 shows an overlay of layers 80 and 86 from the layer 86 side. Arrows 206 are used to show the mapping of each contact region 110 of layer 80 to a contact region 160 in layer 86. Note that for such example, the mapping is performed region by region rather than pin by pin (as in FIGS. 5 and 6). FIG. 10 shows the arrows 206 alone representing the translation performed by the middle layers 82, 84. Note that while a region 110 of layer 80 maps to a single region 160 of layer 86 in the embodiment illustrated, a region (i.e., region 110) at layer 80 may map to multiple regions (i.e., regions 160, 162) at layer 86. As a result a test signal from a pin card 22 may be routed through the translation board 58 to multiple pins at devices 26.

Figure 11A:
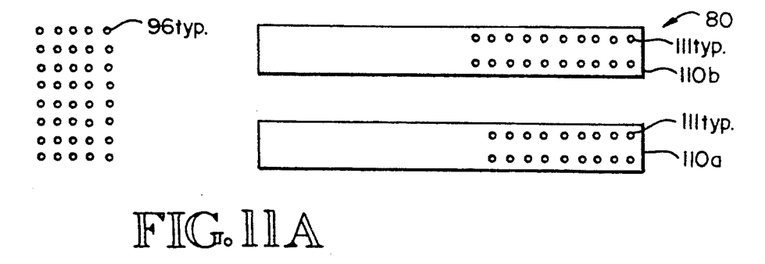
FIGS. 11a-d are diagrams of a post region and contact region for a respective portion of each of four translation board layers.
Figure 11B:
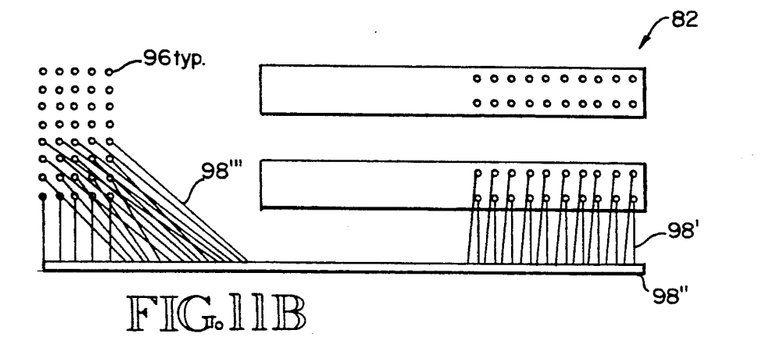
Figure 11C:
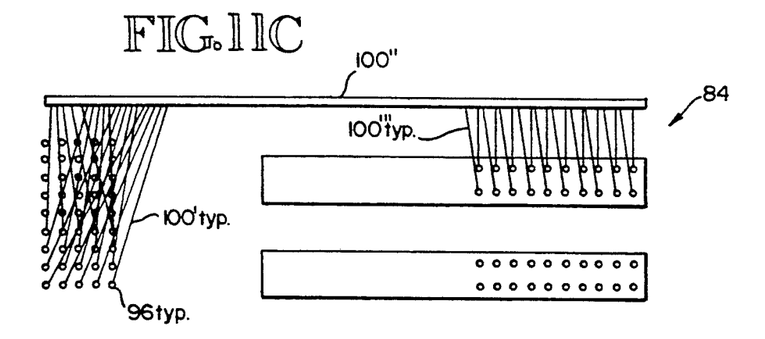
Figure 11D:
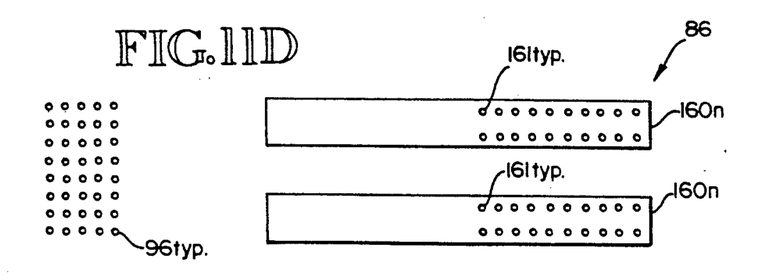

FIGS. 11a–d depict the translation of a region 110a in layer 80 to a region 160n in layer 86. At layer 80 (FIG. 11a) region 110a is formed by a plurality of rows of contacts 111. According to a specific embodiment multiple rows of contacts are provided to form 192 contacts 111. Such contacts 111 provide electrical coupling to pin card 22 I/O pins. The contacts 111 protrude through layer 80 to layer 82 without further protruding to layers 84 and 86. At layer 82 (FIG. 11b) conductive strips 98' couple the contacts 111 to a bus 98". Such bus is formed by conductive stripping leading to the outer area of the translation board 58. At the outer area posts 96 are positioned. Such extend from layer 80 through layer 86. In a specific embodiment, 8 rows of 10 posts per row are used to interconnect the 80 contacts 111 at layer 80 to 80 contacts 161 at layer 86. Conductive strips 98''' provide conductive paths from the bus 98'' to the posts 96 (FIG. 11b). Thus, layer 82 provides paths from contacts 111 to the outer area of the translation board 58. Layer 84 (FIG. 11c) provides the paths from the posts 96 to contacts 161 of the mapped region 160n. In particular, conductive strips 100' provide conductive paths to a bus 100''. The bus provides a path to the inner area of the translation board in the vicinity of the regions 160. Conductive strips 100''' provide the conductive paths from the bus 100'' to the contacts 61. Note that for the embodiment of FIG. 11, the translation is performed region by region. Region 110a maps to region 160n. The relative contact positions of the contacts 111 of region 110a, however, may vary from the relative contact positions within region 160n.

Translation Board Alternate Embodiment

Figure 12:
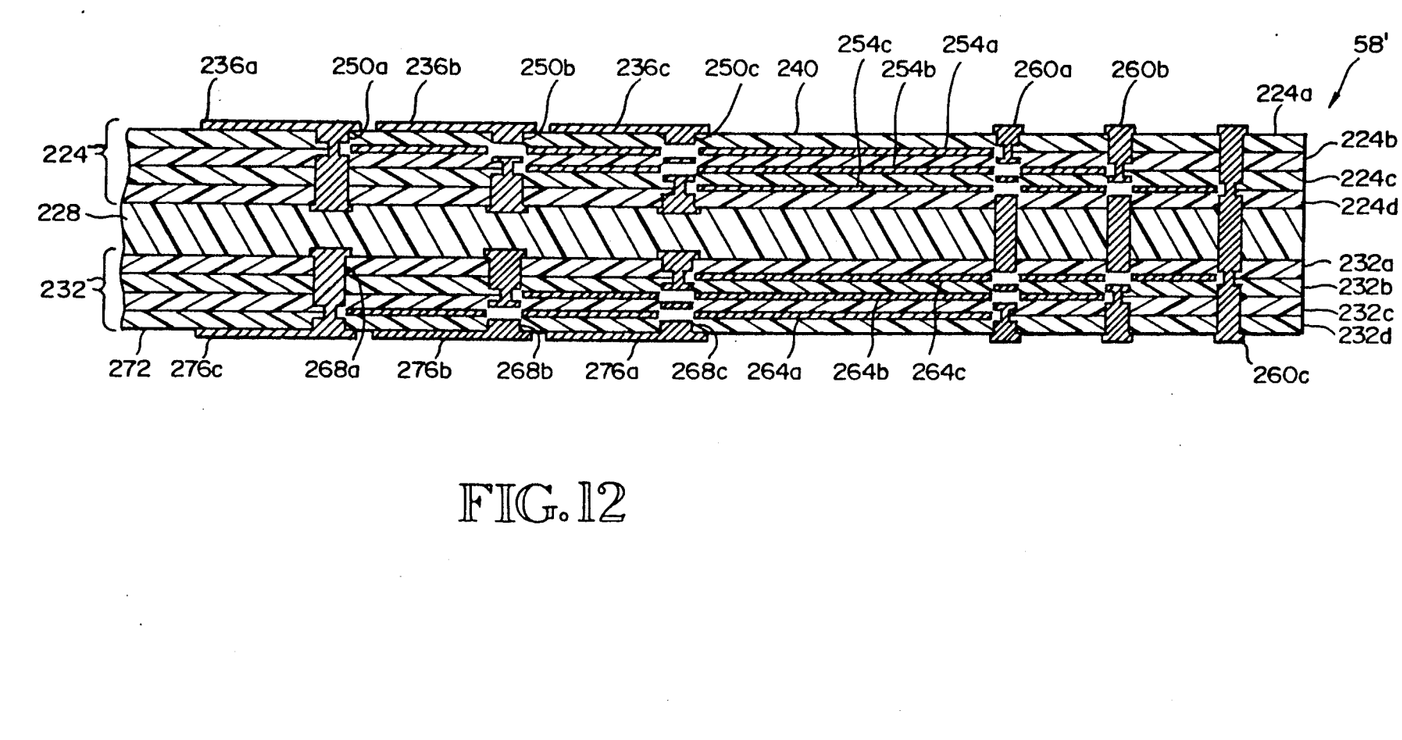
FIG. 12 is an alternative embodiment of a translation board for the receiver of FIG. 4.

FIG. 12 shows a cross-sectional view of a portion of an alternate 16-layer embodiment of a translation board 58'. Translation board 58' comprises a stack of insulating members 224 comprising insulating members 224A–D; an insulating member 228, and a stack of insulating members 232 comprising insulating members 232A–D. A plurality of electrical contacts 236A–C are disposed on an exposed surface 240 of insulating member 224A. Each electrical contact 236A–C is coupled to a corresponding electrical conductor 250A–C which extends through at least one of the insulating members 224A–D in stack 224. In this embodiment, each electrical conductor 250A–C extends through the entire stack 224 through aligned openings in the stack. A plurality of electrical conductors 254A–C are connected to corresponding electrical conductors 250A–C and extend along opposed surfaces of adjacent insulating members in stack 224. In this embodiment, electrical conductor 254A extends between insulating members 224A and 224B; electrical conductor 254B extends between insulating members 224B and 224C; and electrical conductor 254C extends between insulating members 224C and 224D. Of course, it is not necessary for each electrical conductor to be disposed at different levels in the stack if design considerations do not warrant it.

Each electrical conductor 254A–C is connected to an electrical conductor 260A–C. Each electrical conductor 260A–C extends at least from its associated conductor 254A–C through insulating member 228, and to stack 232. In this embodiment, electrical conductors 260A–C extend the entire length through stacks 224 and 232 and insulating member 228 through aligned apertures formed therein. Each electrical conductor 260A–C is electrically connected to a corresponding electrical conductor 264A–C. Each electrical conductor 264A–C extends between opposed surfaces of insulating members 232A–D. In this embodiment, conductor 264A extends between insulating members 232C and 232D; conductor 264B extends between insulating members 232B and 232C; and conductor 264C extends between insulating members 232A and 232B.

Conductors 264A, 264B and 264C are coupled to corresponding electrical conductors 268A, 268B and 268C. Each conductor 268A–C extends from its associated conductor 264A–C to an exposed surface 272 of insulating member 232D. In this embodiment, each electrical conductor 268A–C extends through the entire length of stack 232 through aligned apertures disposed in each insulating member 232A–D. Each electrical conductor 268A–C is electrically connected to a corresponding electrical contact 276A–C that is disposed on surface 272 of insulating member 232D. Insulating member 228 insulates electrical conductors 250A-C from electrical conductors 268A-C. It should be readily apparent that translation board 220 has the capability of converting the pattern represented by contacts 268A-C into a different pattern represented by contacts 236A-C.

According to variations of the FIG. 12 embodiment, the conductors 254A-C and 264A-C in translation board 220 need not be disposed at different levels, and may even extend along the interfaces between stacks 224 and 232 and insulating member 238. In addition, stacks 224 and 232 may be formed as integral members, and insulating member 228 may be formed as a stack of individual members.

Ground Configuration

FIGS. 4 and 7 illustrate the grounding configuration for the receiver 30 according to an embodiment of this invention. As depicted in FIG. 7, the underside of receiver 30 at layer 80 has a ground strip 90 disposed thereon. The ground signal paths for the pin cards 22 are commonly coupled to such ground strip 90 through the herring bone configuration which extends the ground strip 90 to the pin card contact regions 110. An insulating mask (not shown) covers much of the layer 80 (FIG. 7) including the herring bone extremities of the ground strip 90 leaving the contact regions 110 and central ground strip portion unmasked. An insulating block 300 as shown in FIG. 4 covers the central unmasked ground strip portion upon assembly. By providing such a ground strip 90 which runs the length of the translation board 58, a common ground line is available in the vicinity of each module 16 pin card in the interconnecting region (e.g., receiver 30 ) between the modules 16 (17) and circuit panels 26 under test.

As a result of the ground configuration and the short transmission paths achieved with the wireless receiver, the devices under test 26 can share the same ground line as the pin cards 22. In addition, noise injection along the test signal paths is reduced and test signal reliability is improved.

Commercial Embodiment

According to a commercial embodiment of the ATE 10 and receiver 30, up to six modules 16 including up to eight pin cards 22 per module (FIG. 1) are configured in a chassis 34 (FIG. 2) for interconnection to any of multiple fixtures 28 having the same or different underside contact layouts. A receiver 30 is formed of four layers 80, 82, 84, 86 (FIG. 5) having contact regions 110 at layer 80 mapped region by region (FIG. 9) to regions 160 at layer 86. Each region 110, 160 includes up to 192 contacts. As shown in FIGS. 7 and 8 specific regions 110 and 160 may be left empty without contacts depending on the type of testing to be performed and the fixture 28 underside layout to be contacted. The commercial embodiment can be modified to handle different fixture undersides and/or perform different types of testing by reconfiguring the ATE with different modules and/or a different receiver (having a different mapping translation).

Conclusion

In summary, the modular ATE configuration includes a replaceable receiver which enables the ATE to be used for a wide variety of fixtures and circuit boards under test. By replacing a first receiver with a second receiver having a different translation board layout, different mapping is obtained between pin card pins and fixture pins. Thus, the ATE has a versatile configuration which can be easily adapted for fixtures requiring different pin mappings. Consequently, receivers may be selected in accordance with each user's testing needs, then replaced thereafter for changing needs without incurring the cost of an entirely new ATE system.

Further, the translation board provides a minimal length, cableless interconnection environment for the test signal transmission paths so as to improve test signal reliability and noise rejection.

While the above is a complete description of a preferred embodiment of the present invention, various modifications may be employed. Consequently, the scope of the claims should not be limited except as described in the claims.

What is claimed is:

1. An apparatus for testing a printed circuit board in a test system having a test controller and a fixture, a printed circuit board coupled to the fixture, the apparatus coupled to the test controller, the fixture having a base plate supporting a plurality of probe pins, the fixture defining a plurality of first contacts for electrical communication with the apparatus, the apparatus comprising:

a plurality of test modules coupled to the test controller for implementing a printed circuit board test, each test module comprising a module controller and a plurality of pin cards coupled to the module controller, a test module being for generating test signals to be applied to the printed circuit board and for sensing response signals of the printed circuit board;

a wireless receiver for interconnecting the test module to the fixture, comprising:

(a) a prefabricated translation board having a first layer comprising a plurality of means for establishing electrical contact with the test modules, a second layer comprising a plurality of means for defining electrical contact, and a plurality of intermediate layers between said first and second layers for coupling each one of said plurality of contact establishing means to a respective contact defining means according to a prescribed mapping relation wherein the first contact defining means coupled to a first contact establishing means has a different relative position among the plurality of contact defining means than the first contact establishing means has along the plurality of contact establishing means;

(b) a plurality of conductive pin members, a conductive pin member being in physical communication with an electrical contact defining means of said translation board and a first contact of the fixture; and (c) a support block positioned between the fixture and said translation board defining a plurality of channels, a channel receiving a conductive pin member.

2. An apparatus for testing a printed circuit board in a test system having a test controller and a fixture, a printed circuit board coupled to the fixture, the apparatus coupled to the test controller, the fixture having a base plate supporting a plurality of probe pins, the fixture defining a plurality of first contacts for electrical communication with the apparatus, the apparatus comprising:

a test module in communication with the test controller for implementing a printed circuit board test, comprising a module controller and a plurality of pin cards coupled to he module controller, the test module generating test signals to be applied to the printed circuit board and sensing response signals from the printed circuit board;

a wireless receiver for interconnecting the test module to the fixture, comprising:

(a) a prefabricated translation board having a first layer comprising a plurality of means for establishing electrical contact with the test modules, a second layer comprising a plurality of means for defining electrical contact, and a plurality of intermediate layers between said first and second layers for coupling each one of said plurality of contact establishing means to a respective contact defining means according to a prescribed mapping relation wherein the first contact defining means coupled to a first contact establishing means has a different relative position among the plurality of contact defining means than the first contact establishing means has along the plurality of contact establishing means;

(b) a plurality of conductive pin members, a conductive pin member being in physical communication with an electrical contact defining means of said translation board and a first contact of the fixture; and (c) a support block positioned between the fixture and said translation board defining a plurality of channels, a channel receiving a conductive pin member.

3. An apparatus for testing a printed circuit board in a test system having a test controller and a fixture, a printed circuit board coupled to the fixture, the apparatus coupled to the test controller, the fixture having a plurality of first contacts for electrical communication with the apparatus, the apparatus comprising:

a test module in communication with the test controller for implementing a printed circuit board test, comprising a module controller and a plurality of pin cards coupled to he module controller, the test module generating test signals to be applied to the printed circuit board and sensing response signals from the printed circuit board;

a wireless receiver for interconnecting the test module to the fixture, comprising:

(a) a prefabricated translation board having a first layer comprising a plurality of means for establishing electrical contact with the test modules, a second layer comprising a plurality of means for defining electrical contact, and a plurality of intermediate layers between said first and second layers for coupling each one of said plurality of contact establishing means to a respective contact defining means according to a prescribed mapping relation;

(b) a plurality of conducive pin members, a conductive pin member being in physical communication with an electrical contact defining means of said translation board and a first contact of the fixture;

(c) a support block positioned between the fixture and said translation board defining a plurality of channels, a channel receiving a conductive pin member; and (d) an electrical ground path commonly coupled to said plurality of test modules and said fixture, said ground path defining a common ground plane for the test module and printed circuit board under test.

4. The apparatus of claim 3 in which the module controller and plurality of pin cards are arranged in two parallel rows having a central channel between said rows and side channels between pin cards within a row, and further comprising cooling means for forcing air into the central channel and through to the side channels for cooling the module controller and pin cards, said cooling means causing an air flow from the central channel to the side channels so that cool air flows across the module controller and plurality of pin cards.

5. The apparatus of claim 3 in which each conductive pin member comprises a spring-biased conductive pin contact.

6. The apparatus of claim 3 in which the first layer provides electrical contact with the test module at a first contact region, the second layer providing electrical contact with the fixture first contacts at a second region; the plurality of intermediate layers comprising a first intermediate layer and a second intermediate layer; the first intermediate layer comprising means forming a conductive path from said first contact region to an inter-layer contact region, said inter-layer contact region providing an electrical path between intermediate layers of the translation board, the second intermediate layer comprising means forming a conductive path from said interlayer contact region to a second contact region.

7. The apparatus of claim 6 in which said path forming means of said first intermediate layer is comprised of conductive stripping, and said path forming means of said second intermediate layer is comprised of conductive stripping.

8. An apparatus for testing a printed circuit board in a test system having a test controller and a fixture, a printed circuit board coupled to the fixture, the apparatus coupled to the test controller, the fixture having a plurality of first contacts for electrical communication with the apparatus, the apparatus comprising:

a plurality of test modules coupled to the test controller for implementing a printed circuit board test, each test module comprising a module controller and a plurality of pin cards coupled to the module controller, a test module being for generating test signals to be applied to the printed circuit board and for sensing response signals of the printed circuit board;

a wireless receiver for interconnecting the test module to the fixture, comprising:

(a) a prefabricated translation board having a first layer comprising a plurality of means for establishing electrical contact with the test modules, a second layer comprising a plurality of means for defining electrical contact, and a plurality of intermediate layers between said first and second layers for coupling each one of said plurality of contact establishing means to a respective contact defining means according to a prescribed mapping relation;

(b) a plurality of conducive pin members, a conductive pin member being in physical communication with an electrical contact defining means of said translation board and a first contact of the fixture;

(c) a support block positioned between the fixture and said translation board defining a plurality of channels, a channel receiving a conductive pin member; and (d) an electrical ground path commonly coupled to said plurality of test modules and said fixture, said ground path defining a common ground plane for the test module and printed circuit board under test; and in which each conductive pin member contact comprises a spring-biased conductive pin; and in which the first layer provides electrical contact with the test module at a first contact region, the second layer providing electrical contact with the fixture first contacts at a second region; the plurality of intermediate layers comprising a first intermediate layer and a second intermediate layer; the first intermediate layer comprising means forming a conductive path from said first contact region to an inter-layer contact region, said inter-layer contact region providing an electrical path between intermediate layers of the translation board, the second intermediate layer comprising means forming a conductive path from said inter-layer contact region to a second contact region; and in which said path forming means of said first intermediate layer is comprised of conductive stripping, and said path forming means of said second intermediate layer is comprised of conductive stripping.

9. The apparatus of claim 8 in which the plurality of test modules are arranged in two parallel rows having a central channel between said rows and side channels between pin cards within a row, and further comprising cooling means for forcing air into the central channel and through to the side channels for cooling the test modules, said cooling means causing an air flow from the central channel to the side channels so that cool air flows across the module controller and plurality of pin cards of each test module.

10. An apparatus for testing a printed circuit board coupled to a fixture, a test controller coupled to the apparatus for defining a printed circuit board test the apparatus comprising:

a plurality of test modules coupled to the test controller for implementing a printed circuit board test, each test module comprising a module controller and a plurality of pin cards coupled to the module controller, a test module being for generating test signals to be applied to the printed circuit board and for sensing response signals of the printed circuit board; and a wireless receiver for interconnecting the plurality of test modules to the fixture, the receiver comprising means for establishing electrical contact with the plurality of test modules, means for establishing electrical contact with the fixture, and means for mapping the test module electrical contact means to the fixture electrical contact means, the mapping means comprising a prefabricated translation board having integral conductive paths for interconnecting the test module contact means to the fixture contact means according to a prescribed mapping relation;

wherein the translation board comprises:

a stack of first insulating members;

a plurality of third electrical contacts disposed on an exposed surface of an outer first insulating member and having the first pattern;

a plurality of first electrical conductors, each first electrical conductive being electrically connected to a corresponding third electrical contact and extending through at least one of the first insulating members;

a plurality of second electrical conductors, each second electrical conductor being electrically connected to a corresponding first electrical conductor and extending along opposed surfaces of adjacent first insulating members;

a stack of second insulating member;

a third insulating member disposed between the stacks of first and second insulating members;

a plurality of third electrical conductors, each third electrical conductor being electrically connected to a corresponding second electrical conductor and extending through the third insulating member and at least one second insulating member;

a plurality of fourth electrical conductors, each fourth electrical conductor being electrically connected to a corresponding third electrical conductor and extending along opposed surfaces of adjacent second insulating members;

a plurality of fifth electrical conductors, each fifth electrical conductor being electrically connected to a corresponding fourth electrical conductor and extending through the stack of second insulating members to an exposed surface of an outer second insulating member; and a plurality of fourth electrical contacts disposed on the exposed surface of the outer second insulating member, each fourth electrical contact being electrically connected to a corresponding fifth electrical conductor.

11. An apparatus for testing a first printed circuit board coupled to a first fixture and a second printed circuit board coupled to a second fixture, each one of the first fixture and second fixture having a base plate surrounding a plurality of probe pins, each one of the first fixture and second fixture defining a plurality of first contacts, the first contacts of the first fixture and second fixture defining noncompatible underside layouts, a test controller coupled to the apparatus for defining a printed circuit board test, at a given time one of the first and second fixtures being coupled to the apparatus, the printed circuit board coupled to said one fixture being a printed circuit board under test, the apparatus comprising:

a test module coupled to the test controller for implementing a printed circuit board test, the test module comprising a module controller and a plurality of pin cards coupled to the module controller, the test module being for generating test signals to be applied to the printed circuit board under test and for sensing response signals of the printed circuit board under test;

a removable wireless first receiver for interconnecting the test module to the first fixture, the first receiver comprising first means for establishing electrical contact with the test module, first means for defining electrical contact with the first fixture, and first means for mapping the test module first electrical contact means to the fixture first electrical contact means, the first mapping means comprising a first prefabricated translation board having integral conductive paths for interconnecting the test module first contact means to the fixture first contact means according to a first prescribed mapping relation wherein the first contact defining means coupled to the first contact establishing means has a different relative position among the plurality of first contact defining means than the first contact establishing means has among the plurality of first contact establishing means; and a wireless second receiver for replacing said first receiver to interconnect the test module to the second fixture, the second receiver comprising second means for establishing electrical contact with the test module, second means for defining electrical contact with the second fixture, and second means for mapping the test module second electrical contact means, the second mapping means comprising a second prefabricated translation board having integral conductive paths for interconnecting the test module second contact means to the second fixture second contact means according to a second prescribed mapping relation wherein the second contact defining means coupled to the second contact establishing means has a different relative position among the plurality of second contact defining means than the second contact establishing means has along the plurality of second contact establishing means.

12. An apparatus for testing a printed circuit board in a test system having a test controller and a fixture, a printed circuit board coupled to the fixture, the apparatus coupled to the test control, the fixture having a base plate supporting a plurality of probe pins, the fixture defining a plurality of first contacts for electrical communication with the apparatus, the apparatus comprising:

a test module in communication with the test controller for implementing a printed circuit board test, comprising a module controller and a plurality of pin cards coupled to the module controller, the test module generating test signals to be applied to the printed circuit board and sensing response signals from the printed circuit board;

a wireless receiver for interconnecting the test module to the fixture, the receiver comprising means for establishing electrical contact with the plurality of test modules, means for defining electrical contact with the fixture, and means for mapping the test module electrical contact means to the fixture electrical contact means;

the mapping means comprising a prefabricated translation board having integral conductive paths for interconnecting the test module contact means to the fixture contact means according to a prescribed mapping relation wherein the first contact defining means coupled to the first contact establishing means has a different relative position along the plurality of contact defining means than the first contact establishing means has along the plurality of contact establishing means.

13. The apparatus of claim 12 in which the translation board comprises a plurality of layers, a first layer providing electrical contact with a test module at a first contact region, a second layer providing electrical contact with the fixture contact means at a second contact region; a first intermediate layer comprising means forming a conductive path from said first contact region to an inter-layer contact region, said inter-layer contact region providing an electrical path between layers of the translation board, a second intermediate layer comprising means forming a conductive path from said inter-layer contact region to the second contact region.

14. An apparatus for testing a printed circuit board coupled to a fixture, a test controller coupled to the apparatus for defining a printed circuit board test, the apparatus comprising:

a plurality of test module coupled to the test controller for implementing a printed circuit board test, each test module comprising a module controller and a plurality of pin cards coupled to the module controller, a test module being for generating test signals to be applied to the printed circuit board and sensing response signals from the printed circuit board; and a wireless receiver for interconnecting the plurality of test modules to the fixture, the receiver comprising means for establishing electrical contact with the plurality of test modules, means for establishing electrical contact with the fixture, and means for mapping the test module electrical contact means to the fixture electrical contact means;

the mapping means comprising a prefabricated translation board having integral conductive paths for interconnecting the test module contact means to the fixture contact means according to a prescribed mapping relation;

said translation board comprising:

a stack of first insulating members;

a plurality of first electrical contacts disposed on an exposed surface of an outer first insulating member and coupled to at least one pin card through said tester electrical contacts;

a plurality of first electrical conductors, each first electrical conductor being electrically connected to a corresponding first electrical contact and extending through at lest one of the firs insulating members;

a plurality of second electrical conductors, each second electrical conductor being electrically connected to a corresponding first electrical conductor and extending along opposed surfaces of adjacent first insulating members;

a stack of second insulating members;

a third insulating member disposed between the stacks of first and second insulating members;

a plurality of third electrical conductors, each third electrical conductor being electrically connected to a corresponding second electrical conductor and extending through the third insulating member and at least one second insulating member;

a plurality of fourth electrical conductors, each fourth electrical conductor being electrically connected to a corresponding third electrical conductor and extending along opposed surfaces of adjacent second insulating members;

a plurality of fifth electrical conductors, each firth electrical conductor being electrically connected to a corresponding fourth electrical conductor and extending through the stack of second insulating members to an exposed surface of an outer second insulating member, each fifth electrical conductor being electrically coupled to a fixture electrical conductor; and a plurality of second electrical contacts disposed on the exposed surface of the outer second insulating member, each second electrical contact being electrically connected to a corresponding fifth electrical conductor.

* * * * *